United States Patent
Barzen

(10) Patent No.: US 9,875,934 B2
(45) Date of Patent: Jan. 23, 2018

(54) SEMICONDUCTOR DEVICE AND A METHOD FOR FORMING A SEMICONDUCTOR DEVICE

(71) Applicant: Infineon Technologies AG, Neubiberg (DE)

(72) Inventor: Stefan Barzen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/055,246

(22) Filed: Feb. 26, 2016

(65) Prior Publication Data

US 2017/0250112 A1    Aug. 31, 2017

(51) Int. Cl.
*H01L 21/768* (2006.01)
*H01L 23/48* (2006.01)
*H01L 21/24* (2006.01)

(52) U.S. Cl.
CPC ........ *H01L 21/76898* (2013.01); *H01L 21/24* (2013.01); *H01L 21/76838* (2013.01); *H01L 23/481* (2013.01)

(58) Field of Classification Search
CPC ............. H01L 21/76898; H01L 21/768; H01L 21/02063; H01L 21/481
See application file for complete search history.

(56) References Cited

U.S. PATENT DOCUMENTS

| | | | |
|---|---|---|---|
| 8,519,515 B2* | 8/2013 | Kuo ................... | H01L 21/76898 257/621 |
| 2012/0248581 A1* | 10/2012 | Sugiyama ......... | H01L 21/76898 257/622 |
| 2014/0235053 A1* | 8/2014 | Chern ............... | H01L 21/76898 438/667 |
| 2015/0311140 A1* | 10/2015 | Kalnitsky ............. | H01L 23/481 257/774 |

* cited by examiner

*Primary Examiner* — Cuong Q Nguyen
(74) *Attorney, Agent, or Firm* — Shumaker & Sieffert, P.A.

(57) ABSTRACT

A method for forming a semiconductor device comprises forming an insulation trench structure comprising insulation material extending into the semiconductor substrate from a surface of the semiconductor substrate. The insulation trench structure laterally surrounds a portion of the semiconductor substrate. The method further comprises modifying the laterally surrounded portion of the semiconductor substrate to form a vertical electrically conductive structure comprising an alloy material. The alloy material is an alloy of the semiconductor substrate material and at least one metal.

16 Claims, 8 Drawing Sheets

SEMICONDUCTOR DEVICE AND A METHOD FOR FORMING A SEMICONDUCTOR DEVICE

TECHNICAL FIELD

Embodiments relate to semiconductor device structures, and in particular to a semiconductor device and a method for forming a semiconductor device.

BACKGROUND

Forming through silicon vias (TSVs) in semiconductor devices may be challenging due to mechanical stress from etching trenches and filling the trenches with filler material. In addition, thermal stress may significantly reduce the reliability of the semiconductor device if the coefficient of thermal expansion (CTE) is different than the substrate material. The stress and the thermal expansions may limit the design and the process integration options in the production of semiconductor devices. In addition, voids in the filler material, electro migration and reduced conductivity may also cause a reduction in the performance of the semiconductor device. In addition, the costs of forming the TSVs may be high.

SUMMARY

Some embodiments relate to a method for forming a semiconductor device. The method comprises forming an insulation trench structure comprising insulation material extending into the semiconductor substrate from a surface of the semiconductor substrate. The insulation trench structure laterally surrounds a portion of the semiconductor substrate. The method further comprises modifying the laterally surrounded portion of the semiconductor substrate to form a vertical electrically conductive structure comprising an alloy material. The alloy material is an alloy of the semiconductor substrate material and at least one metal.

Some embodiments relate to a semiconductor device. The semiconductor device comprises a vertical electrically conductive structure extending from a first surface of a semiconductor substrate to a second surface of the semiconductor substrate. The vertical electrically conductive structure comprises an alloy material of a metal and a semiconductor substrate material of the semiconductor substrate. An atomic percentage content of the semiconductor substrate material is greater than 30% of the alloy material.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1A:
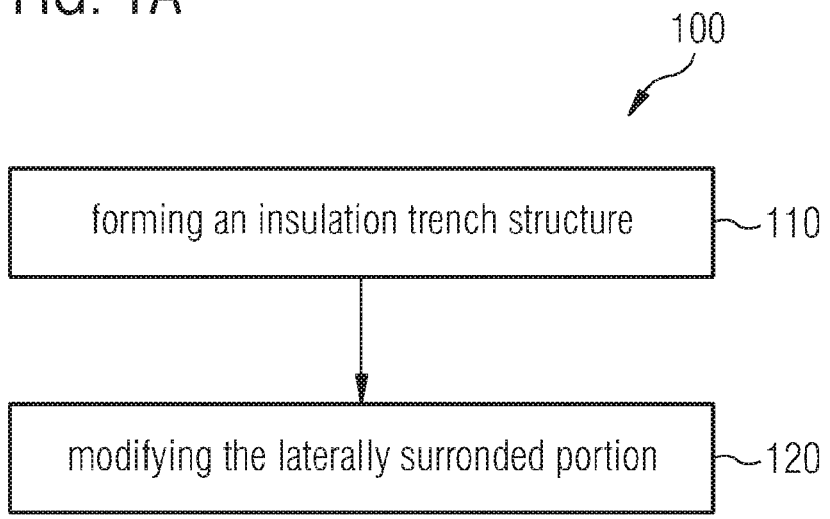
FIG. 1A shows a flow chart of a method for forming a semiconductor device.

FIG. 1A shows a flow chart of a method 100 for forming a semiconductor device.

The method 100 comprises forming 110 an insulation trench structure comprising insulation material extending into the semiconductor substrate from a surface of the semiconductor substrate. The insulation trench structure laterally surrounds a portion of the semiconductor substrate.

The method 100 further comprises modifying 120 the laterally surrounded portion of the semiconductor substrate to form a vertical electrically conductive structure comprising an alloy material. The alloy material is an alloy of the semiconductor substrate material and at least one metal.

Due to the modifying 120 of the laterally surrounded portion of the semiconductor substrate to form a vertical electrically conductive structure, mechanical stress caused by filling a trench with a different filler material (e.g. a metal) may be reduced or avoided, for example. Additionally, thermal stress caused by differences in the coefficient of thermal expansion between the filler material and the semiconductor substrate may be reduced or avoided, for example. Additionally, voids in the filler material, electro migration and reduced conductivity may be reduced or avoided, for example. In addition, costs incurred from using the filler material may be reduced or avoided, for example. Due to the vertical electrically conductive structure comprising an alloy material being an alloy of the semiconductor substrate material and at least one metal, the mechanical and thermal properties may remain almost unchanged compared to the semiconductor substrate material of the semiconductor substrate, and thermal stresses or mechanical stresses may be reduced. Furthermore, high electron mobility may be achieved, thus improving the electrical performance of the vertical electrically conductive structure compared to thin metal vias, for example.

Forming 110 the insulation trench structure may include forming a vertical trench extending into the semiconductor substrate from the surface (e.g. a first lateral surface) of the semiconductor substrate. The vertical trench may be formed by removing semiconductor substrate material from the semiconductor substrate (e.g. by chemical etching), for example.

A minimum (or smallest) width of the vertical trench may be at least 50 nm (or e.g. may lie between 50 nm and 10 μm, or e.g. between 50 nm and 5 μm, or e.g. between 1 μm and 4 μm), for example. The width of the vertical trench may be a distance measured in a lateral direction between a first vertical sidewall of the vertical trench and a second vertical sidewall of the vertical trench, for example.

A minimum (or smallest) depth of the vertical trench may be at least 350 μm (or e.g. at least 100 μm, or e.g. at least 200 μm), for example. For example, the depth of the vertical trench may be a distance measured between the top of the vertical trench and a bottom of the vertical trench in a direction substantially orthogonal (or perpendicular) to the lateral surface of the semiconductor substrate, for example.

The vertical trench may laterally surround (or laterally enclose) a portion of the semiconductor substrate. For example, the vertical trench may have a ring form or a rectangular (or square) form in a top view of the semiconductor substrate.

The laterally surrounded portion of the semiconductor substrate may have a circular form or a rectangular (or square) form in the top view of the semiconductor substrate. A minimum (or smallest) lateral dimension of the laterally surrounded portion may be at least 500 nm (or e.g. may lie between 500 nm and 100 μm, or e.g. between 1 μm and 20 μm, or e.g. between 1 μm and 10 μm), for example. The lateral dimension of a laterally surrounded portion having a circular form may be a diameter of the laterally surrounded portion measured in a direction parallel to the surface of the semiconductor substrate, for example. The lateral dimension of a laterally surrounded portion having a rectangular form may be a width of the laterally surrounded portion measured in a direction parallel to the surface of the semiconductor substrate, for example.

Forming 110 the insulation trench structure may further include forming the insulation material in the vertical trench after forming the vertical trench. Optionally, the insulation material may be formed in the vertical trench by oxidizing the semiconductor substrate to form the insulation material in the vertical trench. Alternatively, the insulation material may be formed in the vertical trench by depositing the insulation material into the vertical trench. The vertical trench may be substantially filled with the insulation material after forming the insulation material in the vertical trench, for example.

The insulation trench structure formed by filling the vertical trench with insulation material may thus extend (vertically) into the semiconductor substrate from the first surface of the semiconductor substrate. The insulation trench structure laterally surrounds the portion of the semiconductor substrate, for example. Additionally, the insulation trench structure may have a ring form or a rectangular form in a top view of the semiconductor substrate.

After forming 110 the insulation trench structure, the laterally surrounded portion of the semiconductor substrate may be modified (or transformed) to form the vertical electrically conductive structure comprising an alloy material, for example.

Modifying 120 the laterally surrounded portion of the semiconductor substrate to form the vertical electrically conductive structure may include forming an electrically conductive layer comprising the at least one metal on (e.g. directly on, or e.g. indirectly on) at least the laterally surrounded portion of the semiconductor substrate. Modifying 120 the laterally surrounded portion of the semiconductor substrate may further include annealing the semiconductor substrate to form the alloy material. The semiconductor substrate may be annealed to form the alloy material after forming the electrically conductive layer, for example. During the modifying 120 of the laterally surrounded portion of the semiconductor substrate, the at least one metal of the electrically conductive layer may mix with the semiconductor substrate material in the laterally surrounded portion to form the alloy material of the vertically electrically conductive structure. The annealing may cause the electrically conductive layer and the semiconductor substrate material of the laterally surrounded portion to melt and mix with each other to form the alloy material, for example. The alloy material formed after the annealing is thus an alloy of the semiconductor substrate material and the at least one metal incorporated from the electrically conductive layer, for example.

Optionally, modifying 120 the laterally surrounded portion of the semiconductor substrate may include controlling the annealing temperature of the semiconductor substrate and/or an atomic ratio of the semiconductor substrate material and the at least one metal to form the vertical electrically conductive structure comprising a eutectic alloy material. The eutectic temperature and the eutectic percentage ratio may define a eutectic point, P, of a phase diagram of the mixture including the semiconductor substrate material and the at least one metal. At the eutectic point, the semiconductor substrate material and the at least one metal melt having a defined atomic ratio (the eutectic percentage ratio) melt at a lowest possible melting temperature (the eutectic temperature).

Figure 1B:
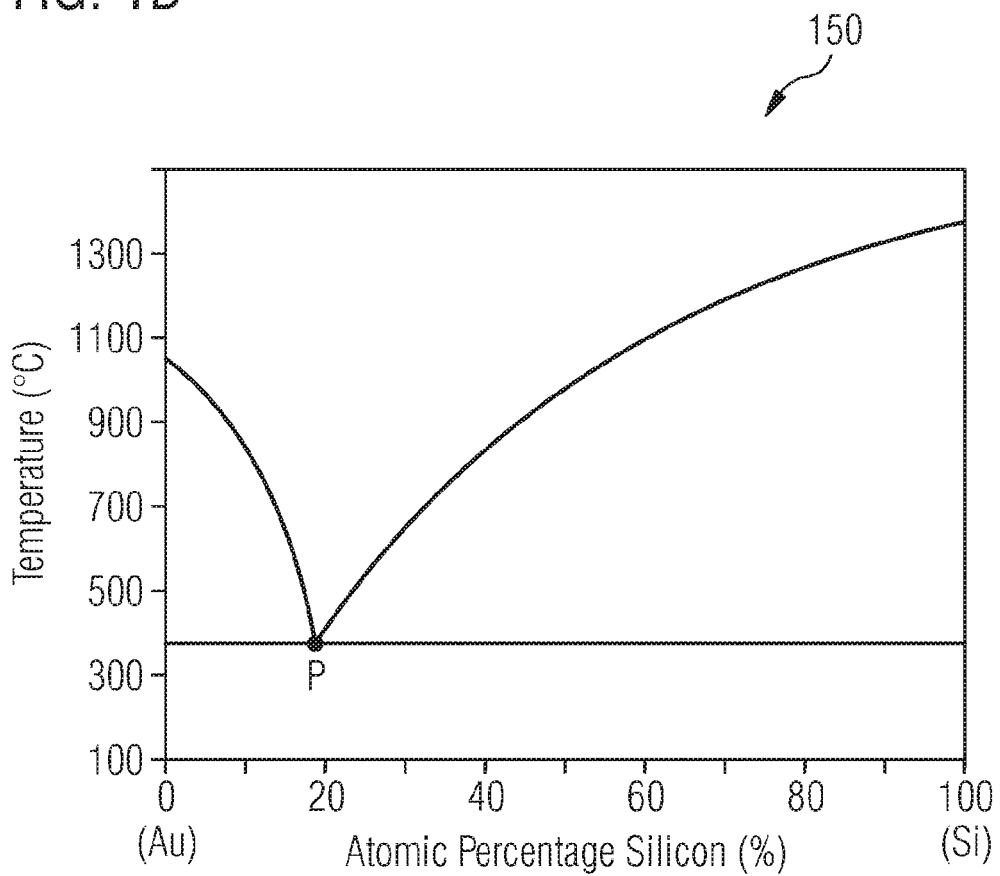
FIG. 1B shows a gold-silicon phase diagram.

Optionally, the annealing temperature of the semiconductor substrate may be controlled (or e.g. varied) to lie within +/−5° C. (or e.g. within +/−10° C.) of a eutectic temperature of the mixture including the semiconductor substrate material and the at least one metal. Additionally, the atomic ratio between the semiconductor substrate material and the at least one metal may be controlled (or e.g. varied) to lie within +/−2% (or e.g. within +/−5%, or e.g. within +/−10%) of a eutectic percentage ratio of the mixture. For example, for a gold-silicon phase diagram as shown in FIG. 1B, a eutectic temperature of 363° C. and a eutectic percentage ratio of 18.5% silicon may define a eutectic point, P.

The semiconductor substrate material may include (predominantly) silicon (e.g. at least 95% silicon, or e.g. at least 99% silicon). For example, the semiconductor substrate may be a silicon (Si) substrate. In the case of the semiconductor substrate being a silicon substrate. The at least one metal may include at least one material selected from the group of materials including (or consisting of) gold (Au), aluminum (Al), platinum (Pt) and titanium (Ti). For example, optionally, the alloy material of the vertical electrically conductive structure may be a binary alloy, such as a Si—Au alloy, a Si—Al alloy, a Si—Pt alloy or a Si—Ti alloy, for example. Alternatively, the alloy material of the vertical electrically conductive structure may be a ternary alloy including more than one more metal (e.g. a Si—Au—Ti alloy).

Optionally, modifying 120 the laterally surrounded portion of the semiconductor substrate may include forming a semiconductor material layer comprising the semiconductor substrate material on at least the laterally surrounded portion of the semiconductor substrate before forming the electrically conductive layer. The electrically conductive layer may be formed on the semiconductor material layer after forming the semiconductor material layer, for example. The semiconductor material layer may function as a eutectic partner collecting layer. Optionally, the semiconductor material layer and the semiconductor substrate material may be the same material, for example.

A lateral surface area of the semiconductor material layer may be at least 10 times larger (or e.g. at least 50 times larger, or e.g. at least 100 times larger) than a lateral surface area of the laterally surrounded portion of the semiconductor substrate. By providing a larger lateral surface area for contacting the electrically conductive layer, a thinner electrically conductive layer may be deposited for forming the alloy material of the vertical electrically conductive structure. For example, if the lateral surface area of the semiconductor material layer is 10 times larger than the lateral surface area of the laterally surrounded portion of the semiconductor substrate, a thickness of the electrically conductive layer may be reduced by 10 times compared to the thickness of the electrically conductive layer if it were directly contacting the laterally surrounded portion of the semiconductor substrate without the semiconductor material layer.

The semiconductor material layer may be modified to form an alloy material identical to the alloy material of the vertical electrical electrically conductive structure during the modifying 120 of the laterally surrounded portion of the semiconductor substrate to form the vertical electrically conductive structure, for example.

The method 100 may further include forming a mask structure on (e.g. directly on) the first surface of the semiconductor substrate before modifying 120 the laterally surrounded portion of the semiconductor substrate. The mask structure may cover (or mask) the first surface of the semiconductor substrate except the laterally surrounded portion of the semiconductor substrate. The laterally surrounded portion of the semiconductor substrate may be unmasked (e.g. uncovered) by the mask structure during the modifying 120 of the laterally surrounded portion of the semiconductor substrate.

As the mask structure does not cover the laterally surrounded portion of the semiconductor substrate, at least part of the electrically conductive layer may be formed on (or contact) the laterally surrounded portion of the semiconductor substrate. For example, a first portion of the electrically conductive layer may be formed directly on the laterally surrounded portion of the semiconductor substrate and a second portion of the electrically conductive layer may be formed directly on at least part of the mask structure. The at least one metal of the electrically conductive layer may be incorporated directly into the laterally surrounded portion of the semiconductor substrate due to a direct contact between the electrically conductive layer and the laterally surrounded portion of the semiconductor substrate, for example.

Optionally or alternatively, if the semiconductor material layer were deposited on the laterally surrounded portion of the semiconductor substrate before forming the electrically conductive layer, at least part of the semiconductor material layer may be formed directly on the laterally surrounded portion of the semiconductor substrate and a second portion of the semiconductor material layer may be formed directly on at least part of the mask structure. The at least one metal of the electrically conductive layer may be incorporated into the semiconductor material layer and the laterally surrounded portion of the semiconductor substrate via (or through) the semiconductor material layer.

Optionally, the mask structure may include an insulation material. For example, the insulation material of the mask structure may include (or may be) an oxide material such as silicon oxide. Alternatively or optionally, the insulation material of the mask structure may include (or may be) a nitride material such as silicon nitride. Optionally, the insulation material may include (or may be) an oxide of the semiconductor substrate material and/or a nitride of the semiconductor substrate material.

Optionally, the insulation material of the mask structure may be deposited on the first surface of the semiconductor substrate (except on the laterally surrounded portion of the semiconductor substrate) by chemical vapor deposition, or sputtering, or a suitable deposition technique after forming 110 the insulation trench structure but before modifying 120 the laterally surrounded portion of the semiconductor substrate. Alternatively or optionally, the insulation material of the mask structure and the insulation material of the insulation trench structure may be formed at the semiconductor substrate during the same process. For example, the insulation material of the mask structure and the insulation material of the insulation trench structure may be formed during the same deposition process or during the same oxidizing process.

The method 100 may further include thinning the semiconductor substrate to expose the insulation trench structure at a second opposite (lateral) surface of the semiconductor substrate before modifying 120 the laterally surrounded portion of the semiconductor substrate. The semiconductor substrate may be thinned from the second surface of the semiconductor substrate by removing semiconductor substrate material (e.g. by chemical mechanical polishing) from the second surface of the semiconductor substrate. The semiconductor substrate may be thinned until the semiconductor substrate has a minimum thickness of at least 30 μm (or e.g. at least 100 μm, or e.g. at least 200 μm), for example. The thickness of the semiconductor substrate (e.g. between the first lateral surface and the second lateral surface of the semiconductor substrate) after thinning may be the final thickness of the semiconductor substrate of the semiconductor device to be formed, for example. By thinning the semiconductor substrate from the second surface of the semiconductor substrate, the insulation trench structure may be exposed at the second surface of the semiconductor substrate. Thus, the insulation trench structure may extend from the first surface of the semiconductor substrate to the second surface of the semiconductor substrate.

The method 100 may further include removing the mask structure and any remaining portions of the electrically conductive layer on the mask structure and/or at the first surface of the semiconductor substrate after modifying 120 the laterally surrounded portion of the semiconductor substrate to form the vertical electrically conductive structure. The method 100 may further include forming an electrically conductive contact pad electrically contacting the vertical electrically conductive structure at the first surface of the semiconductor substrate and/or at the second surface of the semiconductor substrate.

Optionally or alternatively, if the semiconductor material layer were deposited on the laterally surrounded portion of the semiconductor substrate before forming the electrically conductive layer, and if the semiconductor material layer were modified to form an alloy material identical to the alloy material of the vertical electrical electrically conductive structure, the method 100 may include forming an electrically conductive contact pad comprising at least part of the modified semiconductor material layer. For example, forming an electrically conductive contact pad may include structuring the modified semiconductor material layer (which includes alloy material) to form the electrically conductive contact pad, for example.

The method 100 may optionally further include forming a second insulation trench structure including insulation material extending into the semiconductor substrate from the first surface of the semiconductor substrate. The second insulation trench structure may be formed by identical processes as the processes for forming the first insulation trench structure and optionally may be formed during the same processes for forming the first insulation trench structure.

Optionally, the second insulation trench structure may laterally surround the first insulation trench structure. For example, the second insulation trench structure may have a ring form or a rectangular form in the top view of the semiconductor substrate. For example, the second insulation trench structure may be formed laterally around the first insulation trench structure. Optionally or alternatively, the second insulation trench structure may be formed adjacent to at least part of the first insulation trench structure (or may adjoin a portion of the first insulation trench structure) such that at least part of the first insulation trench structure and the adjacent second insulation trench structure may have a ring form or a rectangular form in the top view of the semiconductor substrate. Optionally or additionally, the arrangement of the second insulation trench structure laterally surrounding the first insulation trench structure may be (or may form, or may be used to form) a coaxial signal line of the semiconductor device to be formed.

The method 100 may further include modifying a second portion of the semiconductor substrate located laterally between the second insulation trench structure and at least part of the first insulation trench structure to form a second vertical electrically conductive structure. For example, the second vertical electrically conductive structure may be formed between the first insulation trench structure and the second insulation trench structure.

Optionally, the method 100 may optionally further include forming a third insulation trench structure including insulation material extending into the semiconductor substrate from the first surface of the semiconductor substrate. The third insulation trench structure may be formed by identical processes as the processes for forming the first insulation trench structure and the second insulation trench structure and optionally may be formed during the same processes for forming the first insulation trench structure and the second insulation trench structure. The method 100 may optionally further include modifying the third portion of the semiconductor substrate located laterally between the third insulation trench structure and at least part of the second insulation trench structure to form a third vertical electrically conductive structure. Optionally or additionally, the arrangement of the third insulation trench structure laterally surrounding the second insulation trench structure, and the second insulation trench structure laterally surrounding the first insulation trench structure may be (or may form, or may be used to form) a triaxial signal line of the semiconductor device to be formed.

The number of insulation trench structures is not necessarily limited to one, two or three insulation trench structures as described herein, but may be single continuous insulation trench structure, or may be a plurality of insulation trench structures.

Optionally or alternatively, the method 100 may include forming the (continuous) insulation trench structure such that a plurality of portions of the semiconductor substrate may each be laterally surrounded by portions of the insulation trench structure.

The method 100 may include forming a plurality of vertically electrically conductive structures by modifying the plurality of laterally surrounded portions of the semiconductor substrate laterally surrounded by the portions of the insulation trench structure.

As described herein, the semiconductor substrate may be a silicon-based semiconductor substrate. For example, the semiconductor substrate may be float zone (FZ) silicon-based semiconductor substrate or a Czochralski (CZ) silicon-based semiconductor substrate. Optionally or alternatively, the semiconductor substrate 102 may be a silicon carbide (SiC)-based semiconductor substrate, or gallium arsenide (GaAs)-based semiconductor substrate, or a gallium nitride (GaN)-based semiconductor substrate, for example. The electrically conductive layer may include at least one suitable metal for forming an alloy material including the semiconductor substrate material and the at least one metal.

The semiconductor substrate of the semiconductor device may be part of an (active) semiconductor chip or die including one or more electrical device circuits (e.g. including at least a transistor structure, a diode structure, or a p-n junction) formed at the same semiconductor substrate as the vertical electrically conductive structure (or TSV).

A first lateral surface or front side surface of the semiconductor substrate may be a surface of the semiconductor substrate towards metal layers, insulation layers and/or passivation layers on top of the surface of the substrate or a surface of one of these layers. For example, a semiconductor substrate front side may be the side at which active elements of the chip are formed. For example, in a power semiconductor chip, a chip front side may be a side of the chip at which a first source/drain region and a gate region are formed, and a chip back side may be a side of the chip at which a second source/drain region is formed. For example, more complex structures may be located at the chip front side than at the chip back side.

Optionally or alternatively, the semiconductor substrate of the semiconductor device may an interposer substrate which may be located between active chips at which one or more electrical device structures are formed.

A lateral surface of the semiconductor substrate may be a substantially even plane (e.g. neglecting unevenness of the semiconductor structure due to the manufacturing process and trenches). For example, the lateral dimension of the lateral surface of the semiconductor substrate may be more than 100 times larger (or more than 1000 times or more than 10000 times) than a maximal height of structures on the main surface. In comparison to a basically vertical edge (e.g. resulting from separating the substrate of the chip from others) of the semiconductor substrate, the lateral surface may be a basically horizontal surface extending laterally. The lateral dimension of the lateral surface of the semiconductor substrate may be more than 100 times larger (or more than 1000 times or more than 10000 times) than a basically vertical edge of the semiconductor substrate, for example.

A lateral direction may be a direction (or any direction) substantially parallel to a lateral surface of the semiconductor substrate, for example. A vertical direction may be a direction substantially orthogonal (or perpendicular) to the lateral surface of the semiconductor substrate, for example.

The term "lateral", whose usage may be applied to describing relative positions of elements of the figures, (e.g. X is laterally adjacent to Y) may be interpreted to mean that X is located adjacent to Y along a lateral direction. Similarly, the term "vertical" when used for describing relative positions of elements of the figures (e.g. X is vertically adjacent to Y) may be interpreted to mean that X is located adjacent to Y along a vertical direction.

The term "vertical" as used herein to describe the "vertical trench" and the "vertical electrically conductive structure", may be interpreted to mean that the vertical trench (and the vertical electrically conductive structure) extends from the first lateral surface of the semiconductor substrate towards a second opposite lateral surface of the semiconductor substrate. The term "vertical" does not limit the sidewalls of the vertical trench to being perpendicular to the lateral surfaces of the semiconductor substrate (e.g. an angle between the sidewalls of the trench and a lateral surface of the semiconductor substrate is not limited to being 90°), although 90° may be an example of an angle between the sidewalls of the trench and the lateral surface of the semiconductor substrate. For example, an angle between the sidewalls of the vertical trench and the lateral surfaces of the semiconductor substrate may lie between 25° and 155° (or e.g. between 45° and 135°, or e.g. between 80° and 110°).

Method 100 relates to forming (or creating) a through silicon via (TSV) where the base material silicon remains in the via and forms a eutectic composite with a eutectic partner. The mechanical properties remain similar to the base material but the electrical properties are greatly changed to a highly conductive and stable interconnect. Gold and aluminum may be eutectic partners for Si, but a variety of other eutectic partners may alternatively or additionally be used. Alternatively, three-party eutectics may be used and may provide even lower eutectic temperatures, for example.

Method 100 may be used for forming a TSV instead of processing a TSV by etching a via into the substrate, covering the via with an insulator and filling the via with a metal (e.g. copper, tungsten, gold) or doped silicon. The TSVs formed by the latter approach may face challenges due to mechanical stress from the etch and the filled material. Furthermore thermal stress may significantly reduce the reliability if the coefficient of thermal expansion (CTE) is different from the substrate material. The stress and the thermal expansions may limit the design and the process integration options in production. Voids in the conductive material, electro migration and reduced conductivity may also present challenges which may be avoided by method 100. High costs may also be reduced by method 100. The eutectic vias formed by the method 100 may be able to circumvent these challenges as most of the silicon remains in the via, keeping the mechanical and thermal properties almost unchanged. Due to the high electron mobility the electrical performance may be greatly improved compared to thin metal vias.

FIG. 1B shows a gold-silicon phase diagram having a eutectic temperature and a eutectic percentage ratio which define a eutectic point, P.

For a gold-silicon phase diagram, a eutectic temperature of 363° C. and a eutectic percentage ratio of 18.5% silicon may define the eutectic point, P.

FIGS. 2A to 2H show schematic illustrations of a method 200 for forming a semiconductor device.

Figure 2A:
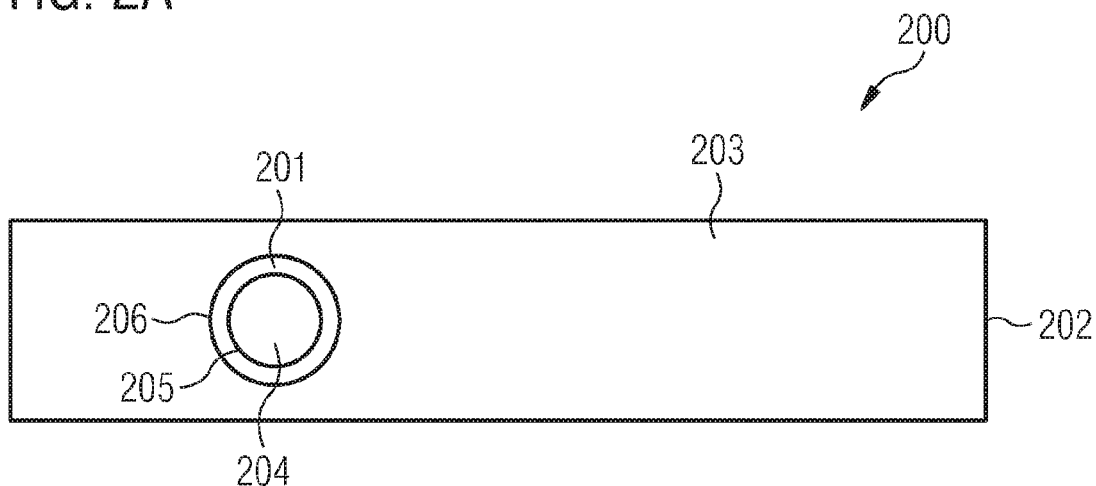
FIGS. 2A to 2H show schematic illustrations of a method for forming a semiconductor device.
Figure 2B:
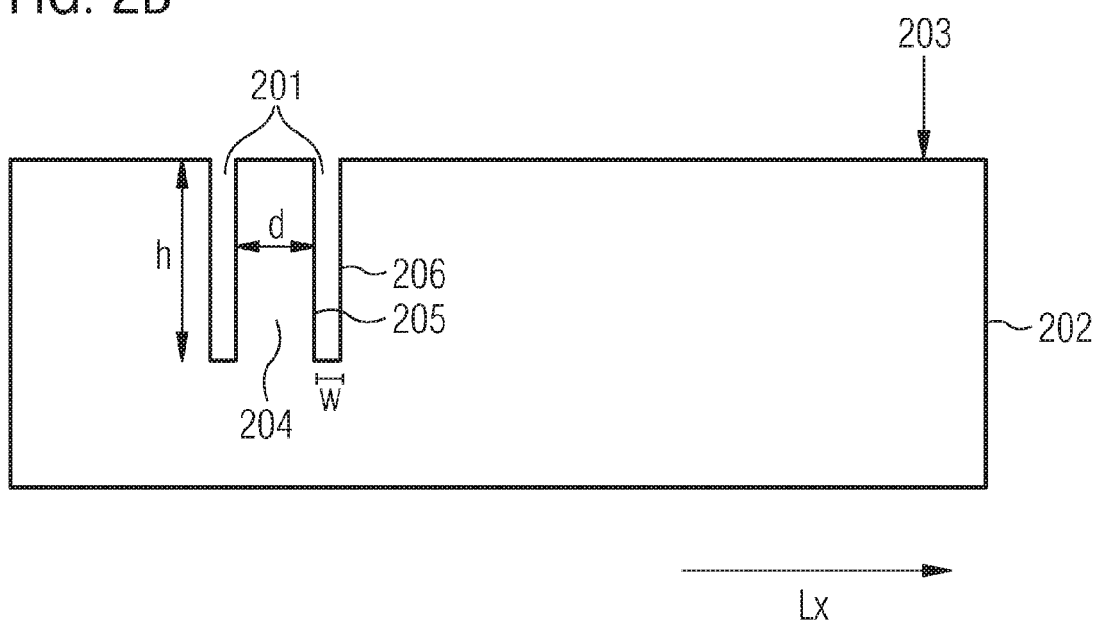

FIGS. 2A and 2B show respectively a top view and a cross-sectional view of at least part of a process for forming an insulation trench structure.

Forming the insulation trench structure may include forming a vertical trench 201 (e.g. etched wall) extending into the semiconductor substrate 202 from the first lateral surface 203 of the semiconductor substrate. The vertical trench 201 may be formed by etching a trench (or hole) into the semiconductor substrate, for example. The vertical trench 201 may extend from the first lateral surface 203 towards the opposite second lateral surface of the semiconductor substrate 202, for example.

A minimum (or smallest) width, w, of the vertical trench 201 (as shown in FIG. 2B) may be at least 50 nm (or e.g. may lie between 50 nm and 10 µm, or e.g. between 50 nm and 5 µm, or e.g. between 1 µm and 4 µm), for example. The width of the vertical trench may be a distance measured in a lateral direction, Lx, between a first vertical sidewall 205 of the vertical trench 201 and a second vertical sidewall 206 of the vertical trench 201, for example.

A minimum (or smallest) depth, h, of the vertical trench 201 may be at least 30 µm (or e.g. at least 100 µm, or e.g. at least 200 µm), for example. The depth of the vertical trench may be a distance measured between the top of the vertical trench and a bottom of the vertical trench in a direction substantially orthogonal (or perpendicular) to the lateral surface of the semiconductor substrate, for example.

The vertical trench 201 may laterally surround a portion 204 of the semiconductor substrate 202. For example, the vertical trench 201 may laterally enclose the laterally surrounded portion 204 of the semiconductor substrate 202 in a top view. For example, as shown in FIG. 2A, the vertical trench 201 may have a ring form in a top view of the semiconductor substrate 202. Optionally or alternatively, the vertical trench may have a rectangular (or square) form in the top view of the semiconductor substrate 202.

The laterally surrounded portion 204 of the semiconductor substrate 202 may have a circular form (or alternatively rectangular or square form) in the top view of the semiconductor substrate. A minimum (or smallest) lateral dimension, d, of the laterally surrounded portion 204 may be at least 500 nm (or e.g. may lie between 500 nm and 100 µm, or e.g. between 1 µm and 20 µm, or e.g. between 1 µm and 10 µm), for example.

Figure 2C:
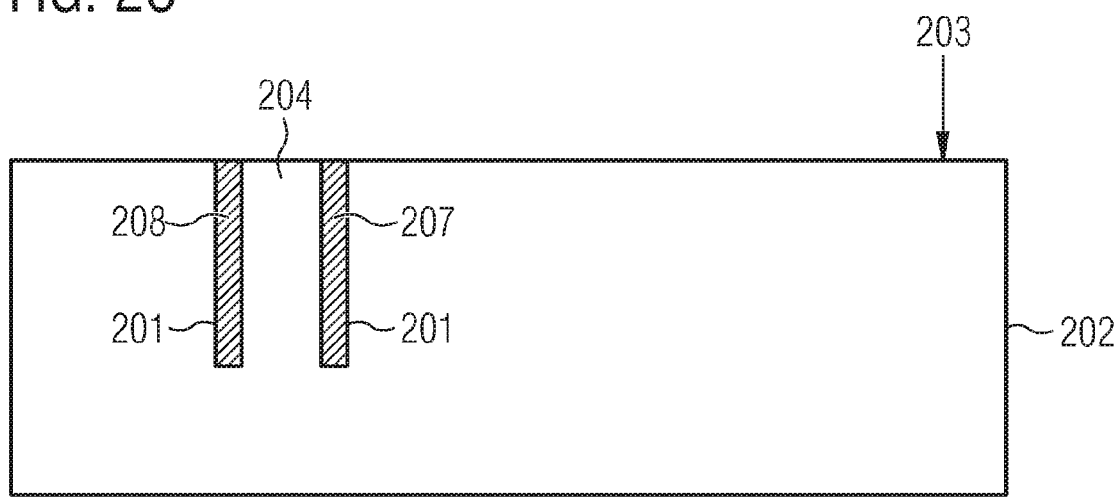

FIG. 2C shows a cross-sectional view of the forming of insulation material 207 (e.g. for isolation) in the vertical trench 201 to form the insulation trench structure 208.

Forming the insulation trench structure 208 may include forming the insulation material 207 in the vertical trench 201 after forming the vertical trench 201. The vertical trench 201 may be substantially filled with the insulation material 207 (e.g. forming a filled wall) due to the forming of the insulation material 207 in the vertical trench 201, for example.

Optionally, the insulation material 207 may be formed in the vertical trench 201 by oxidizing (e.g. by thermal oxidation of) portions of the semiconductor substrate laterally adjacent to (or laterally surrounding) the vertical trench 201 and/or portions of the semiconductor substrate at the bottom of the vertical trench. Alternatively, the insulation material 207 may be formed in the vertical trench 201 by depositing the insulation material 207 (e.g. by a deposition of an insulator) into the vertical trench 201. The insulation material 207 may be formed at the bottom of the vertical trench and on the sidewalls of the vertical trench 201, for example.

The insulation trench structure 208 may thus extend into the semiconductor substrate 202 from the first surface 203 of the semiconductor substrate. For example, the insulation trench structure 208 may extend from the first lateral surface 203 towards the opposite second lateral surface of the semiconductor substrate 202.

The laterally surrounded portion 204 of the semiconductor substrate 202 may be laterally surrounded by the insulation trench structure 208 in a top view of the semiconductor substrate.

Figure 2D:
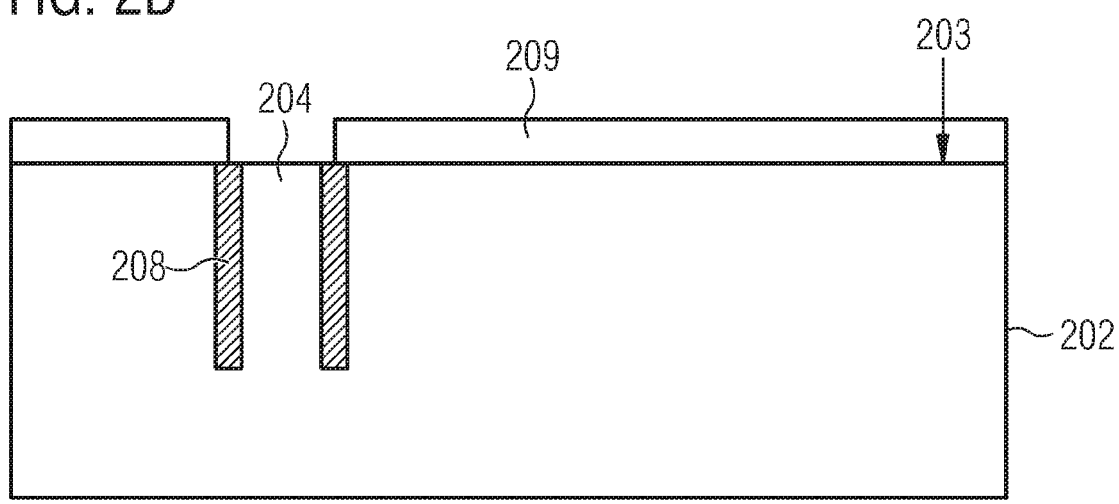

FIG. 2D shows a cross-sectional view of the forming of a mask structure 209.

The mask structure 209 may be formed on (e.g. directly on) the first surface of the semiconductor substrate after forming the insulation trench structure 208. The mask structure 209 may cover (or mask) the first surface 203 of the semiconductor substrate except the laterally surrounded portion 204 of the semiconductor substrate 202. For example, the mask structure may provide a front side window at or on the laterally surrounded portion of the semiconductor substrate.

Optionally, the mask structure 209 may include an insulation material. For example, the insulation material of the mask structure may include (or may be) an oxide material such as silicon oxide and/or tetraethyl orthosilicate (TEOS). Alternatively or optionally, the insulation material of the mask structure 209 may include (or may be) a nitride material such as silicon nitride. Optionally, the insulation material may include (or may be) an oxide of the semiconductor substrate material and/or a nitride of the semiconductor substrate material.

Optionally, the insulation material of the mask structure 209 may be deposited on the first surface 203 of the semiconductor substrate and/or at least partially on the insulation trench structure 208 by chemical vapor deposition, or sputtering, or a suitable deposition technique after forming the insulation trench structure 208.

Figure 2E:
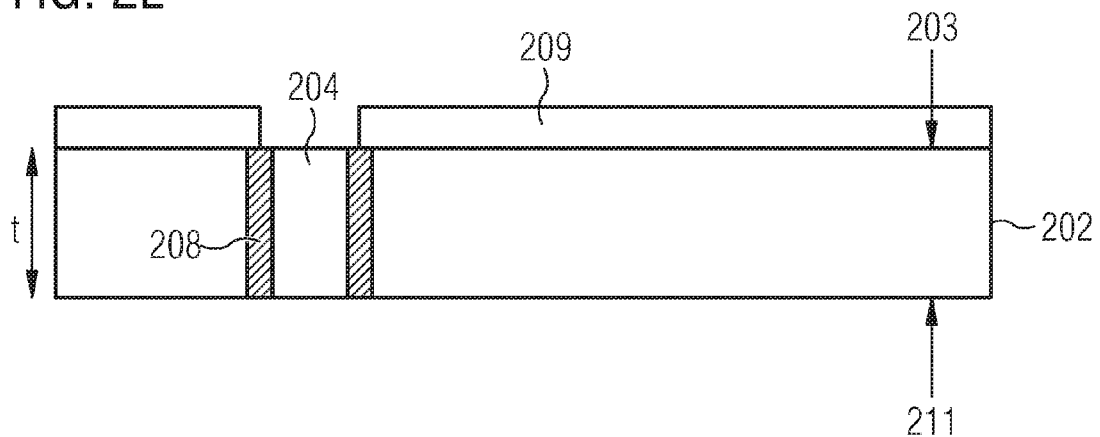

FIG. 2E shows a cross-sectional view of the thinning of the semiconductor substrate 202.

The thinning of the semiconductor substrate 202 may expose the insulation trench structure at a second opposite (lateral) surface 211 of the semiconductor substrate 202. The semiconductor substrate 202 may be thinned from the second surface of the semiconductor substrate 202 by removing semiconductor substrate material evenly (e.g. by chemical mechanical polishing) from the second surface of the semiconductor substrate.

The semiconductor substrate 202 may be thinned until the semiconductor substrate has a minimum thickness, t, of at least 30 µm (or e.g. at least 100 µm, or e.g. at least 200 µm), for example. The thickness of the semiconductor substrate 202 after thinning the semiconductor substrate may be the final thickness of the semiconductor substrate 202 of the semiconductor device to be formed, for example. By thinning the semiconductor substrate from the second surface of the semiconductor substrate, the insulation trench structure 208 may be exposed at the second lateral surface 211 of the semiconductor substrate 202. Thus, the insulation trench structure may extend from the first lateral surface 203 of the semiconductor substrate 202 to the second lateral surface 211 of the semiconductor substrate 202.

Figure 2F:
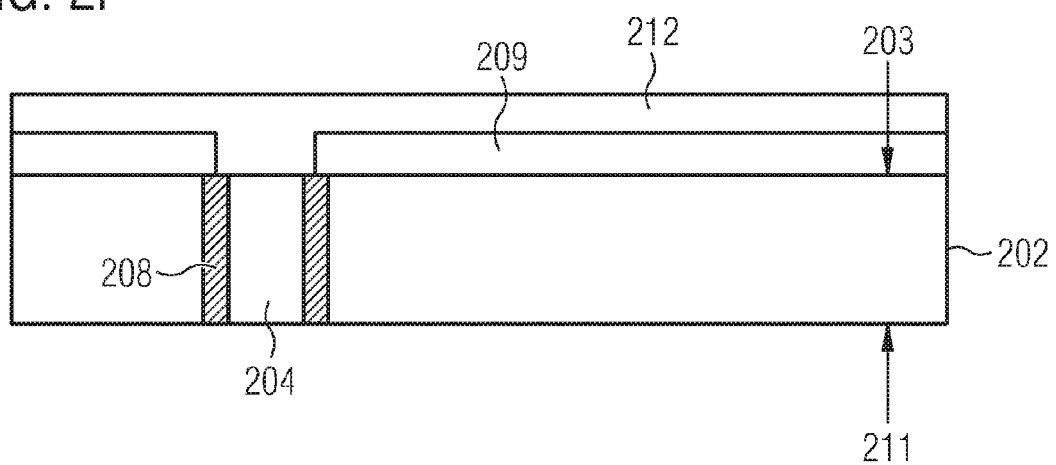

FIG. 2F shows a cross-sectional view of the forming of an electrically conductive layer 212 (e.g. a eutectic partner deposition).

As the mask structure 209 does not cover the laterally surrounded portion 204 of the semiconductor substrate 202, at least part of the electrically conductive layer 212 may be formed on (or directly contact) the laterally surrounded portion 204 of the semiconductor substrate 202. For example, a first portion of the electrically conductive layer 212 may be formed directly on the laterally surrounded portion 204 of the semiconductor substrate and a second portion of the electrically conductive layer 212 may be formed directly on at least part of the mask structure 209.

The electrically conductive layer 212 may include at least one metal. For example, the electrically conductive layer 212 may be a gold layer, an aluminum layer, a platinum layer or a titanium layer.

A minimum (or smallest) thickness of the electrically conductive layer 212 may be at least 50 nm (or e.g. may lie between 50 nm and 10 µm, or e.g. between 50 nm and 5 µm, or e.g. between 1 µm and 4 µm), for example. Additionally or optionally, the thickness of the electrically conductive layer 212 may be selected based on a desired atomic percentage ratio between the semiconductor substrate material of the laterally surrounded portion 204 and the at least one metal. For example, the thickness of the electrically conductive layer 212 may be selected to lie within +/−2% (or e.g. within +/−5%, or e.g. within +/−10%) of a eutectic percentage ratio between the semiconductor substrate material of the laterally surrounded portion 204 and the at least one metal.

Figure 2G:
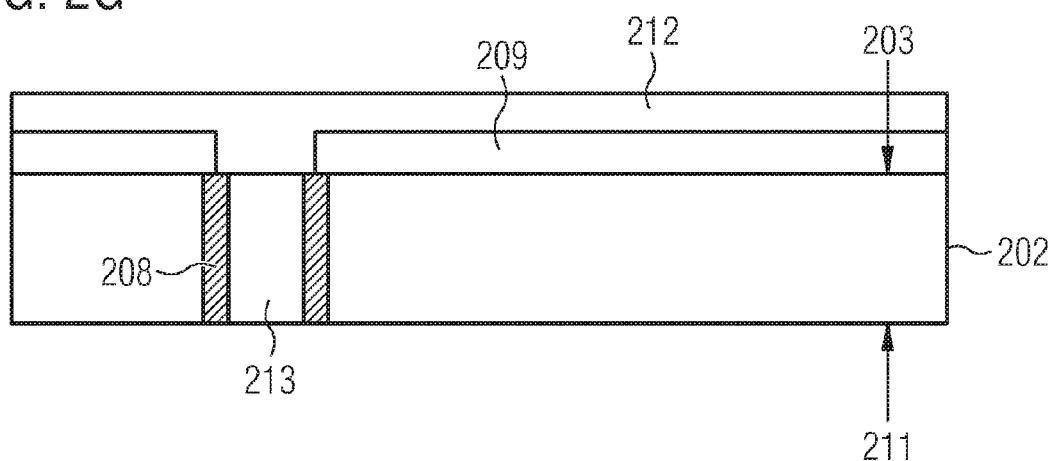

FIG. 2G shows a cross-sectional view of the modifying of the laterally surrounded portion of the semiconductor substrate 202 to form the vertically electrically conductive structure 213.

The laterally surrounded portion of the semiconductor substrate 202 may be annealed to form the alloy material of the vertically electrically conductive structure 213 after forming the electrically conductive layer. For example, the annealing temperature of the semiconductor substrate may be controlled (or e.g. varied) to lie within +/−5° C. (or e.g. within +/−10° C.) of a eutectic temperature of the mixture including the semiconductor substrate material and the at least one metal.

The at least one metal of the electrically conductive layer 212 may be incorporated directly into the laterally surrounded portion of the semiconductor substrate 202 due to a direct contact between the electrically conductive layer 212 and the laterally surrounded portion of the semiconductor substrate 202, for example. The alloy material may be formed by a mixing (e.g. eutectic melting) of the semiconductor substrate material of the laterally surrounded portion and the at least one metal of the electrically conductive layer 212. Thus, the alloy material formed after the annealing may be an alloy of the semiconductor substrate material and the at least one metal incorporated from the electrically conductive layer 212, for example. An atomic percentage content of the semiconductor substrate material of the alloy material of the vertical electrically conductive structure 213 may be greater than 30% (or e.g. greater than 50%, or e.g. greater than 80%) of the alloy material.

Figure 2H:
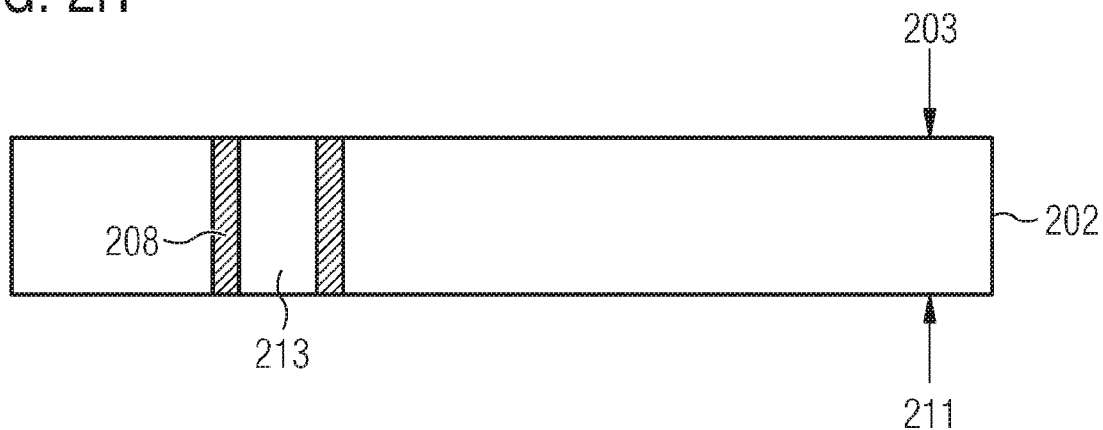

FIG. 2H shows a cross-sectional view of the removing of the mask structure and remaining portions of the electrically conductive layer on the mask structure (e.g. top layer removal).

The mask structure and/or any remaining portions of the electrically conductive layer at the first surface 203 of the semiconductor substrate 202 may be removed after forming the vertical electrically conductive structure 213.

Optionally, after removing the mask structure and/or the remaining portions of the electrically conductive layer, the method 200 may further include forming an electrically conductive contact pad electrically contacting the vertical electrically conductive structure 213 at the first surface 203 and/or at the second surface 211 of the semiconductor substrate 202.

More details and aspects are mentioned in connection with the embodiments described above or below. The embodiments shown in FIGS. 2A to 2H may each comprise one or more optional additional features corresponding to one or more aspects mentioned in connection with the proposed concept or one or more embodiments described above (e.g. FIGS. 1A to 1B) or below (e.g. FIGS. 3 to 7).

Figure 3:
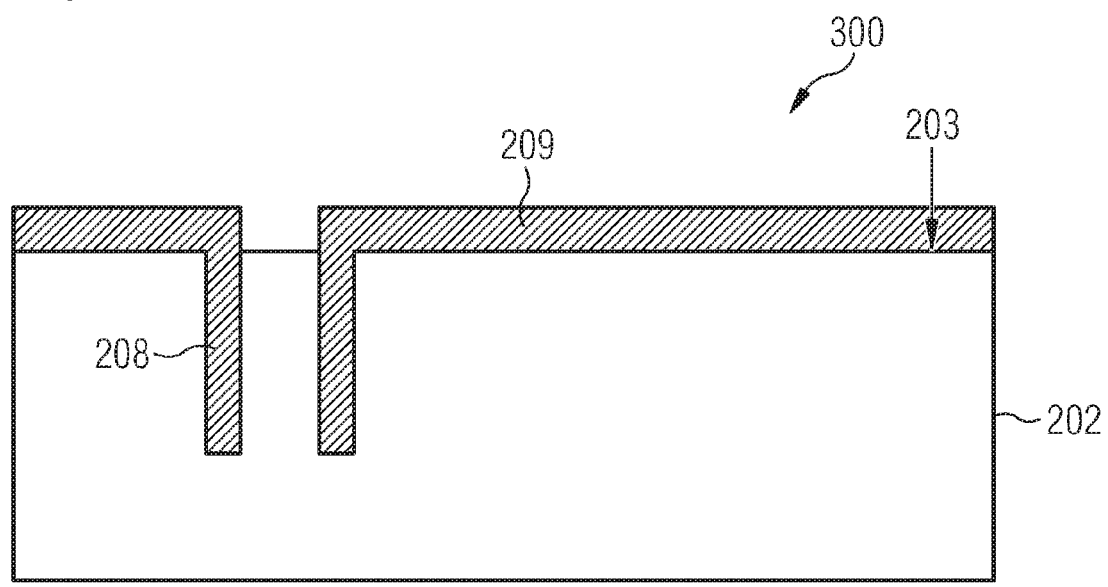
FIG. 3 shows a schematic illustration of a method for forming a semiconductor device including forming an insulation material of a mask structure and an insulation trench structure during the same deposition process.

FIG. 3 shows a schematic illustration of at least part of a method 300 for forming the semiconductor device. The method 300 may be similar to the methods described in connection with FIG. 1 and/or FIGS. 2A to 2H.

In method 300, instead of forming the mask structure 209 after forming the insulation trench structure 208, the insulation material of the mask structure 209 and the insulation material of the insulation trench structure 208 may be formed at the semiconductor substrate 202 during the same process. For example, the insulation material of the mask structure 209 and the insulation material of the insulation trench structure 208 may be formed during the same deposition process or during the same oxidizing process. Thus, the insulator deposition and the front side window may be formed during the same process.

Optionally or additionally, the insulation material of the mask structure 209 and the insulation material of the insulation trench structure 208 may be formed before modifying the laterally surrounded portion of the semiconductor substrate 202 and before thinning the semiconductor substrate 202, for example. Due to the forming of the insulation material of the mask structure 209 and the insulation material of the insulation trench structure 208 during the same process, the mask structure 209 and the insulation trench structure 208 may be a continuous insulating structure comprising the same (e.g. identical) insulation material, for example.

More details and aspects are mentioned in connection with the embodiments described above or below. The embodiments shown in FIG. 3 may comprise one or more optional additional features corresponding to one or more aspects mentioned in connection with the proposed concept or one or more embodiments described above (e.g. FIGS. 1A to 2H) or below (e.g. FIGS. 4A to 7).

Figure 4A:
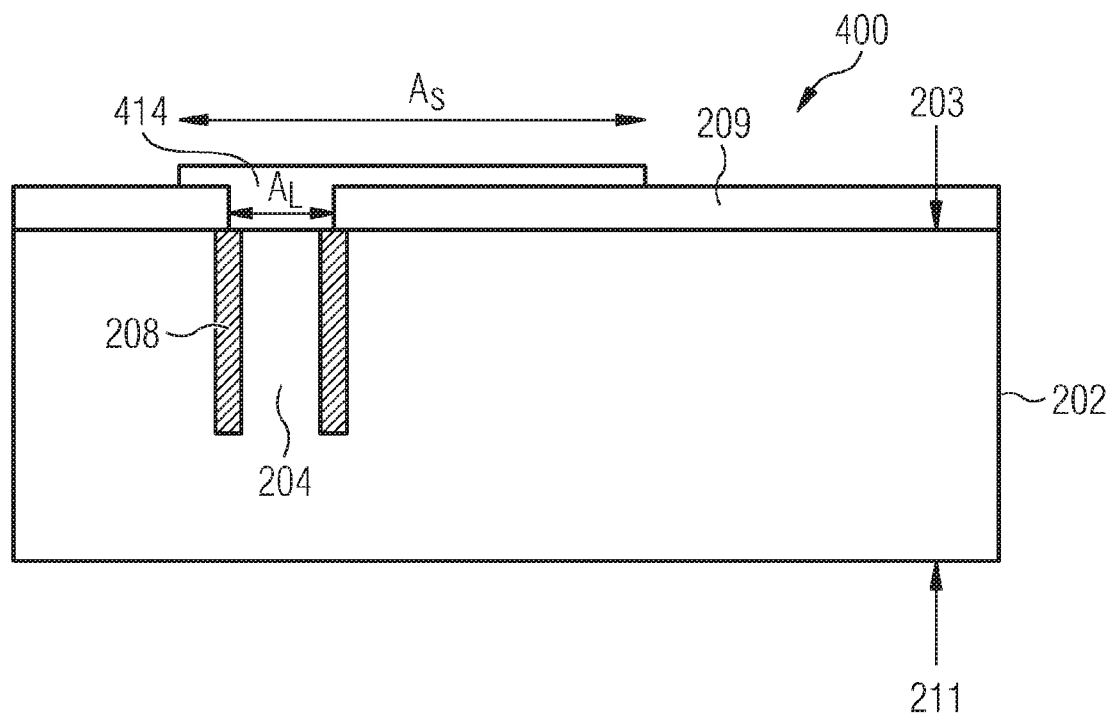
FIGS. 4A to 4B show schematic illustrations of a method for forming a semiconductor device including forming a semiconductor material layer and modifying the semiconductor material layer.
Figure 4B:
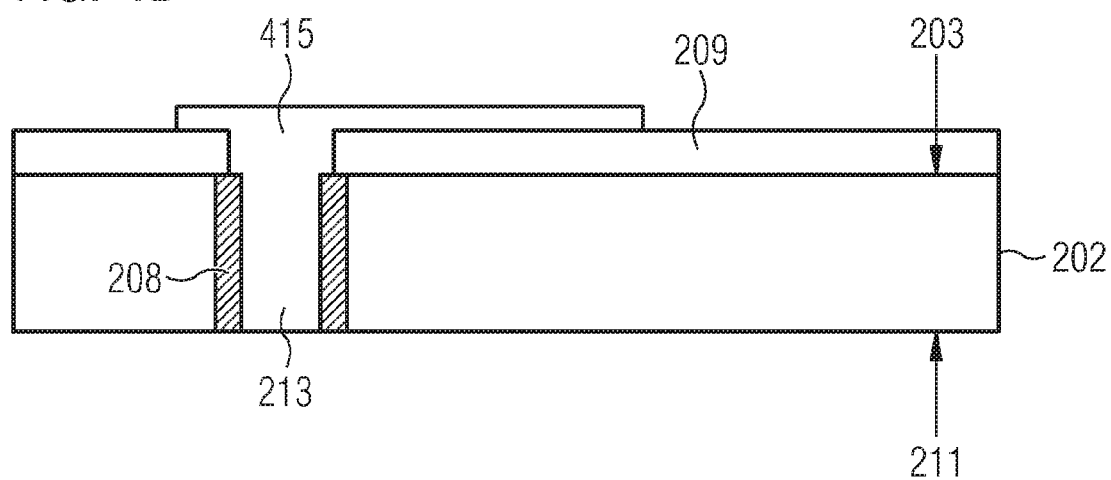

FIGS. 4A and 4B show schematic illustrations of at least part of a method 400 for forming the semiconductor device.

The method 400 may be similar to the methods described in connection with FIGS. 1A to 1B, FIGS. 2A to 2H and/or FIG. 3.

As shown in FIG. 4A, modifying 120 the laterally surrounded portion of the semiconductor substrate may further include forming a semiconductor material layer 414 (e.g. an optional eutectic partner collecting layer) comprising the semiconductor substrate material on at least the laterally surrounded portion 204 of the semiconductor substrate 202 before forming the electrically conductive layer. For example, a first portion of the semiconductor material layer 414 may be formed directly on the laterally surrounded portion 204 of the semiconductor substrate 202 and a second portion of the semiconductor material layer 414 may be formed directly on at least part of the mask structure 209.

Optionally, the semiconductor material layer 414 may be formed before thinning the semiconductor substrate, or alternatively after thinning the semiconductor substrate. Optionally, the semiconductor material layer and the semiconductor substrate material may be the same material, for example.

A lateral surface area, As, of the semiconductor material layer may be at least 10 times larger (or e.g. at least 50 times larger, or e.g. at least 100 times larger) than a lateral surface area, AL, of the laterally surrounded portion of the semiconductor substrate. By providing a larger lateral surface area for contacting the electrically conductive layer, a thinner electrically conductive layer may be deposited for forming the alloy material of the vertical electrically conductive structure.

The electrically conductive layer may be formed on the semiconductor material layer 414 after forming the semiconductor material layer, for example. The contact surface area between the electrically conductive layer and the semiconductor material layer 414 may be larger (e.g. at least 10 times larger, or e.g. at least 50 times larger, or e.g. at least 100 times larger) than a contact surface area between the electrically conductive layer and the lateral surface area, AL, of the laterally surrounded portion of the semiconductor substrate, if the electrically conductive layer were to contact the laterally surrounded portion of the semiconductor substrate directly. Thus, a thickness of the electrically conductive layer may be proportionately smaller (e.g. at least 10 times smaller, or e.g. at least 50 times smaller, or e.g. at least 100 times smaller) than a thickness of the electrically conductive layer if it were directly contacting the laterally surrounded portion of the semiconductor substrate without the semiconductor material layer.

As shown in FIG. 4B, the semiconductor material layer may be modified to form an alloy material identical to the alloy material of the vertical electrical electrically conductive structure 213 during the modifying of the laterally surrounded portion of the semiconductor substrate to form the vertical electrically conductive structure 213, for example.

The at least one metal of the electrically conductive layer may be incorporated into the semiconductor material layer and the laterally surrounded portion of the semiconductor substrate 202 via (or through) the semiconductor material layer. Additionally, the alloy material of the modified semiconductor material layer 415 may be formed by the mixing (e.g. melting) of the semiconductor material layer and the at least one metal of the electrically conductive layer 212.

Optionally or additionally, the method 400 may further include forming an electrically conductive contact pad comprising at least part of the modified semiconductor material layer 415. For example, forming the electrically conductive contact pad may include structuring the modified semiconductor material layer 415 to form the electrically conductive contact pad. Thus, the remaining eutectic partner collecting layer may be used for pads or for routing.

More details and aspects are mentioned in connection with the embodiments described above or below. The embodiments shown in FIGS. 4A to 4B may each comprise one or more optional additional features corresponding to one or more aspects mentioned in connection with the proposed concept or one or more embodiments described above (e.g. FIGS. 1A to 3) or below (e.g. FIGS. 5A to 7).

Figure 5A:
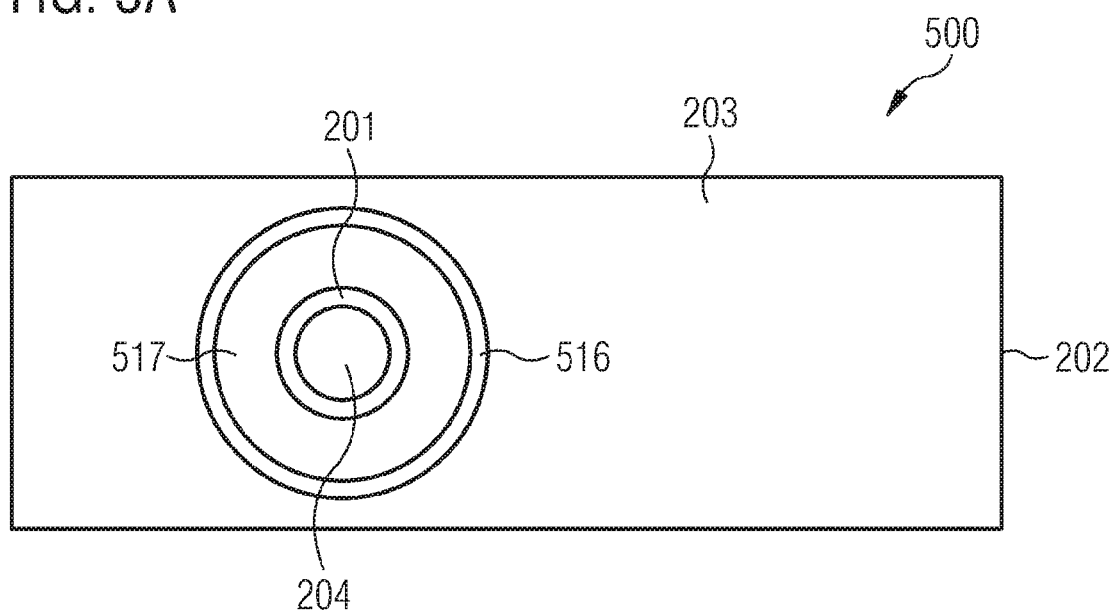
FIGS. 5A to 5B show schematic illustrations of a method for forming a semiconductor device including forming a second vertical electrically conductive structure.
Figure 5B:
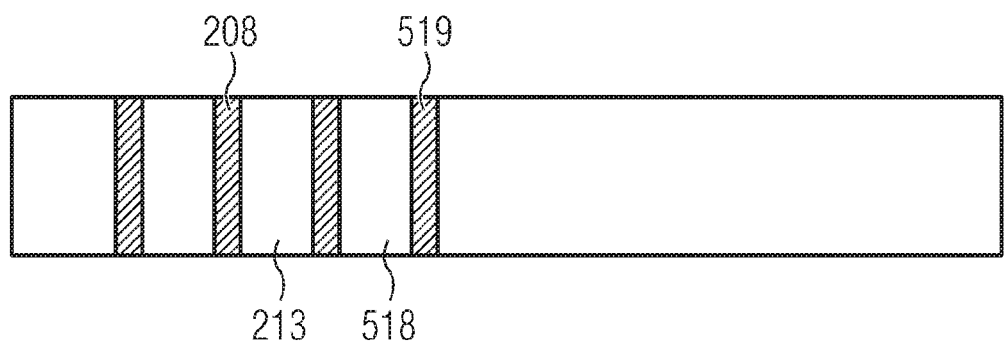

FIGS. 5A and 5B show respectively a top view and a side view schematic illustration of at least part of a method 500 for forming the semiconductor device. The method 500 may be similar to the methods described in connection with FIGS. 1A to 1B, FIGS. 2A to 2H, FIG. 3 and/or FIGS. 4A to 4B.

FIG. 5A shows a top view of at least part of a process for forming a first insulation trench structure and a second insulation trench structure.

Forming the second insulation trench structure may further include forming a second vertical trench 516 extending into the semiconductor substrate 202 from the first surface 203 of the semiconductor substrate 202. The second vertical trench 516 and the first vertical trench 201 (the etched walls) may be formed during the same process, for example.

The second vertical trench 516 may have a ring form or a rectangular form in the top view of the semiconductor substrate. For example, the second insulation trench structure may enclose or be formed laterally around the first insulation trench structure. A second portion 517 of the semiconductor substrate (e.g. a second laterally surrounded portion 517) may be located laterally between the second vertical trench 516 and the first vertical trench 201.

FIG. 5B shows a side view of at least part of a process for forming the second vertical electrically conductive structure.

The second insulation trench structure 519 may be formed by identical processes as the processes for forming the first insulation trench structure 208 (e.g. by filling the second vertical trench with insulation material. The second insulation trench structure 519 may thus extend into the semiconductor substrate from the first surface 203 of the semiconductor substrate 202.

The method 500 may further include modifying the second laterally surrounded portion of the semiconductor substrate located laterally between the second insulation trench structure 519 and the first insulation trench structure 208 to form a second vertical electrically conductive structure 518. For example, the second vertical electrically conductive structure 518 may be formed laterally between the first insulation trench structure 208 and the second insulation trench structure 519. Thus, a shielded eutectic via may be formed between the first insulation trench structure 208 and the second insulation trench structure 519. The method 500 may include modifying of the first laterally surrounded portion and the second laterally surrounded portion during the same process, for example.

Figure 6A:
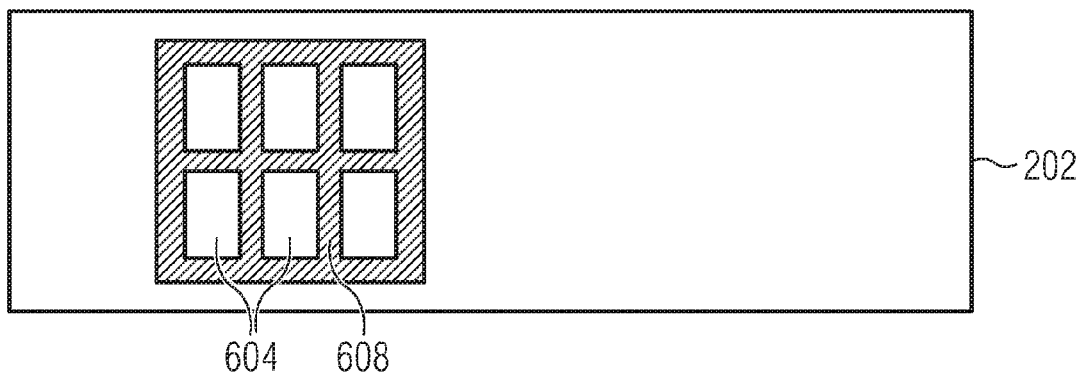
FIGS. 6A to 6B show schematic illustrations of a method for forming a semiconductor device including forming a plurality of vertical electrically conductive structures.
Figure 6B:
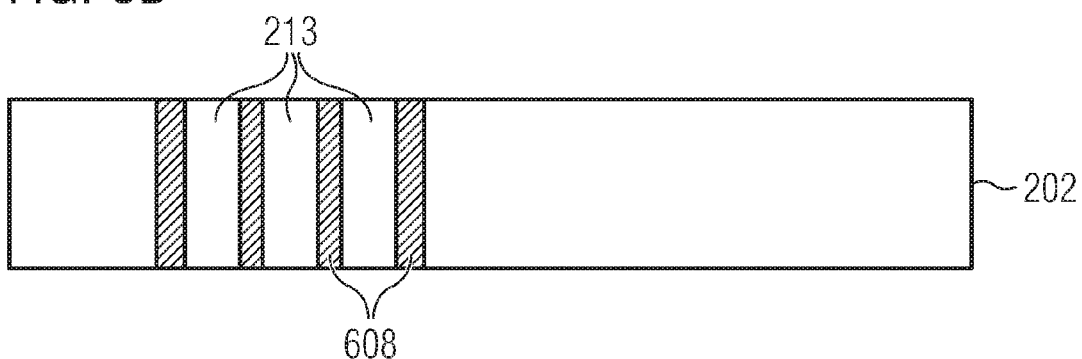

FIGS. 6A and 6B show respectively a top view and a side view schematic illustration of at least part of a method 600 for forming the semiconductor device. The method 600 may be similar to the methods described in connection with FIGS. 2A to 2H, FIG. 3, FIGS. 4A to 4B and/or FIGS. 5A to 5B.

More details and aspects are mentioned in connection with the embodiments described above or below. The embodiments shown in FIGS. 5A to 5B may each comprise one or more optional additional features corresponding to one or more aspects mentioned in connection with the proposed concept or one or more embodiments described above (e.g. FIGS. 1A to 4B) or below (e.g. FIGS. 6A to 7).

FIG. 6A shows a top view of at least part of a process for forming a plurality of vertically electrically conductive structures (e.g. shielded eutectic vias).

In method 600, an insulation trench structure 608 may be formed such that a plurality of portions 604 of the semiconductor substrate 202 may each be laterally surrounded by portions of the insulation trench structure 608. For example, etched walls (or vertical trenches may be formed such that common sidewalls may be located between the vias to be formed.

FIG. 6B shows a side view of at least part of a process for forming a plurality of vertical electrically conductive structures.

The plurality of vertically electrically conductive structures 213 may be formed by modifying the plurality of laterally surrounded portions 604 of the semiconductor substrate 202. The plurality of vertically electrically conductive structures 213 formed may each be laterally surrounded by portions of the insulation trench structure 608.

The plurality of laterally surrounded portions of the semiconductor substrate may have a rectangular (or square) form in the top view of the semiconductor substrate 202, for example. Alternatively, the plurality of laterally surrounded portions of the semiconductor substrate may have a circular form in the top view of the semiconductor substrate 202. The common sidewalls may be located between the vias for a higher via density, for example.

More details and aspects are mentioned in connection with the embodiments described above or below. The embodiments shown in FIGS. 6A to 6B may each comprise one or more optional additional features corresponding to one or more aspects mentioned in connection with the proposed concept or one or more embodiments described above (e.g. FIGS. 1A to 5B) or below (e.g. FIG. 7).

Figure 7:
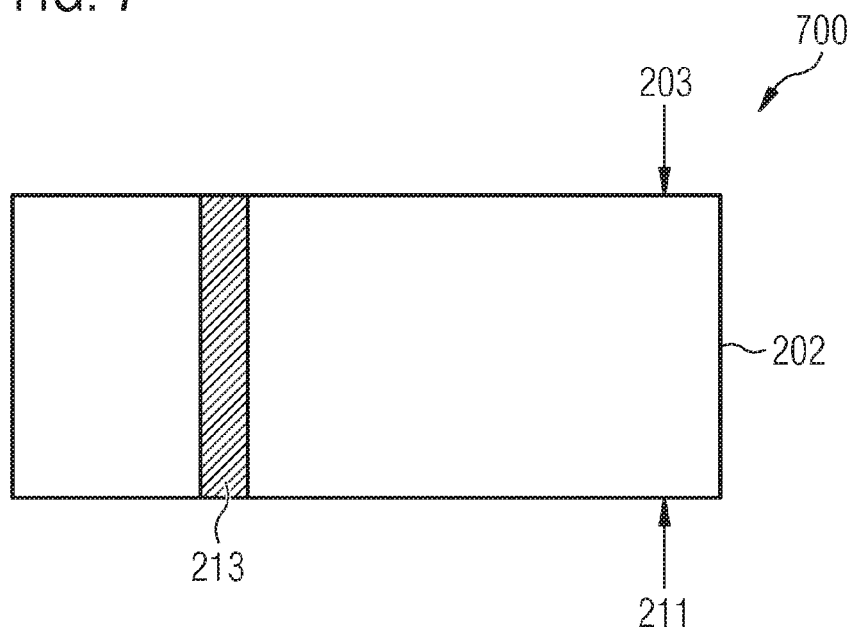
FIG. 7 shows a schematic illustration of a semiconductor device.

FIG. 7 shows a schematic illustration of a semiconductor device 700.

The semiconductor device 700 comprises a vertical electrically conductive structure 213 extending from a first surface 203 of a semiconductor substrate 202 to a second surface 211 of the semiconductor substrate 202.

The vertical electrically conductive structure 213 comprises an alloy material of a metal and a semiconductor substrate material of the semiconductor substrate 202. An atomic percentage content of the semiconductor substrate material is greater than 30% of the alloy material.

Due to the vertical electrically conductive structure comprising an alloy material being an alloy of the semiconductor substrate material and at least one metal, the mechanical and thermal properties may remain almost unchanged compared to the semiconductor substrate material of the semiconductor substrate. Thus, thermal stresses or mechanical stresses may be reduced. Furthermore, high electron mobility may be achieved, thus improving the electrical performance of the vertical electrically conductive structure compared to thin metal vias, for example.

Optionally or additionally, an atomic percentage content of the semiconductor substrate material of the alloy material of the vertical electrically conductive structure may be greater than 30% (or e.g. greater than 50%, or e.g. greater than 80%) of the alloy material.

Optionally or additionally, a minimum (or smallest) lateral dimension (e.g. a width, or e.g. a diameter) of the vertical electrically conductive structure may be at least 500 nm (or e.g. may lie between 500 nm and 100 μm, or e.g. between 1 μm and 20 μm, or e.g. between 1 μm and 10 μm), for example.

Optionally or additionally, a minimum (or smallest) vertical height of the vertical electrically conductive structure may be at least 30 μm (or e.g. at least 100 μm, or e.g. at least 200 μm), for example. The vertical height of the vertical electrically conductive structure may be (substantially) equal to a thickness of the semiconductor substrate after thinning the semiconductor substrate. In other words, the vertical electrically conductive structure may be exposed at the first side surface 203 of the semiconductor substrate 202 and at the second surface 211 of the semiconductor substrate 202.

Optionally or additionally, an insulation material may be located between the semiconductor substrate 202 and the vertical electrically conductive structure 213. For example, the insulation material may have a thickness of at least 50 nm (or e.g. may lie between 50 nm and 10 μm, or e.g. between 50 nm and 5 μm, or e.g. between 1 μm and 4 μm), for example. Optionally or additionally, the insulation material may include (or may be) an oxide material such as silicon oxide and/or tetraethyl orthosilicate (TEOS). Alternatively or optionally, the insulation material may include (or may be) a nitride material such as silicon nitride. Optionally, the insulation material may include (or may be) an oxide of the semiconductor substrate material and/or a nitride of the semiconductor substrate material.

The vertical electrically conductive structure 213 may be one of a plurality of vertical electrically conductive structure 213 of the semiconductor device. The (or each) vertical electrically conductive structure 213 of the semiconductor device may be a through silicon via (TSV) structure extending from the first surface 203 of the semiconductor substrate 202 to the second surface 211 of the semiconductor substrate 202. The (or each) through silicon vias (TSV) may be a vertical electrical contact through the substrate of an electronic device. They may be used as an alternative to wire bonding or flip chip assembly, for example. The TSVs may provide the ability for a stacked chip assembly, higher contact densities or improved electrical performance due to reduced connector length. They may also allow for smaller chips since the area is normally smaller than pads for the other bonding techniques. With eutectic vias the density of contacts may be increased, the electrical performance improved, the costs reduced and the reliability issues due to mechanical and/or thermal stress and electromigration may be reduced or eliminated.

The semiconductor device 700 may be a central processing unit (CPU), a memory, a MEMS device, a transmitter or a receiver, for example. For example, the semiconductor substrate of the semiconductor device 700 may be part of a semiconductor chip or die including one or more electrical device circuits (e.g. including at least a transistor structure, a diode structure, or a p-n junction) formed at the same semiconductor substrate as the vertical electrically conductive structure (or TSV). Optionally, the semiconductor chip may be a power semiconductor device chip having a breakdown voltage or blocking voltage of more than 10V (or e.g. more than 100 V, or e.g. more than 500 V), for example.

Optionally or alternatively, the semiconductor substrate of the semiconductor device may an interposer substrate without electrical device circuits. Optionally, the semiconductor substrate of the semiconductor device may be located laterally adjacent to a further semiconductor chip or die of the semiconductor device at which one or more electrical device structures are formed.

Optionally, the semiconductor device 700 may be formed by the method described in connection with FIGS. 1A to 1B, FIGS. 2A to 2H, FIG. 3, FIGS. 4A to 4B, FIGS. 5A to 5B and/or FIGS. 6A to 6B. Thus, the semiconductor device 700 may include one or more or all of the features described in connection with the semiconductor device to be formed by these methods.

More details and aspects are mentioned in connection with the embodiments described above or below. The embodiments shown in FIG. 7 may each comprise one or more optional additional features corresponding to one or more aspects mentioned in connection with the proposed concept or one or more embodiments described above (e.g. FIGS. 1A to 6B) or below.

Various examples relate to eutectic vias.

Aspects and features (e.g. the semiconductor device, the vertical trench, the insulation trench structure, the insulation material, the semiconductor substrate, the surface of the semiconductor substrate, the laterally surrounded portion of the semiconductor substrate, the alloy material, the electrically conductive layer, the mask structure, the semiconductor material layer, the electrically conductive contact pad, the vertical electrically conductive structure and the second insulation trench structure) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure.

Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a semiconductor device, the method comprising:
   forming an insulation trench structure comprising insulation material extending into the semiconductor substrate from a surface of the semiconductor substrate, wherein the insulation trench structure laterally surrounds a portion of the semiconductor substrate; and
   modifying the laterally surrounded portion of the semiconductor substrate to form a vertical electrically conductive structure comprising an alloy material, wherein the alloy material is an alloy of the semiconductor substrate material and at least one metal.

2. The method according claim 1, wherein modifying the laterally surrounded portion of the semiconductor substrate comprises forming an electrically conductive layer comprising the at least one metal on at least the laterally surrounded portion of the semiconductor substrate.

3. The method according claim 1, wherein modifying the laterally surrounded portion of the semiconductor substrate comprises annealing the semiconductor substrate to form the alloy material.

4. The method according claim 1, wherein the at least one metal comprises at least one material selected from the group of materials comprising gold, aluminum, platinum and titanium.

5. The method according claim 1, wherein forming the insulation trench structure comprises forming a vertical trench extending into the semiconductor substrate from the surface of the semiconductor substrate, and forming the insulation material in the vertical trench.

6. The method according claim 1, further comprising forming a mask structure on the surface of the semiconductor substrate, wherein the laterally surrounded portion of the semiconductor substrate is unmasked by the mask structure during the modifying of the laterally surrounded portion of the semiconductor substrate.

7. The method according to claim 6, wherein the mask structure comprises an insulation material.

8. The method according to claim 2, further comprising forming a semiconductor material layer comprising the semiconductor substrate material on at least the laterally surrounded portion of the semiconductor substrate, wherein the electrically conductive layer is formed on the semiconductor material layer.

9. The method according to claim 8, wherein a lateral surface area of the semiconductor material layer is at least 10 times larger than a lateral surface area of the laterally surrounded portion of the semiconductor substrate.

10. The method according to claim 8, wherein the semiconductor material layer is modified to form an alloy material identical to the alloy material of the vertical electrical electrically conductive structure.

11. The method according to claim 10, further comprising forming an electrically conductive contact pad comprising at least part of the modified semiconductor material layer.

12. The method according claim 1, wherein the insulation trench structure has a ring form or a rectangular form in a top view of the semiconductor substrate.

13. The method according claim 1, wherein the semiconductor substrate material comprises silicon.

14. The method according claim 1, further comprising
   forming a second insulation trench structure comprising insulation material extending into the semiconductor substrate from the surface of the semiconductor substrate; and
   modifying a second portion of the semiconductor substrate located laterally between the second insulation trench structure and at least part of the first insulation trench structure to form a second vertical electrically conductive structure.

15. The method according to claim 14, wherein the second insulation trench structure laterally surrounds the first insulation trench structure to form a coaxial signal line.

16. The method according claim 14, further comprising
   forming a third insulation trench structure laterally surrounding the second insulation trench structure to form a triaxial signal line.

* * * * *